(12) United States Patent
Weekamp et al.

(10) Patent No.: US 7,884,289 B2
(45) Date of Patent: Feb. 8, 2011

(54) METHOD FOR MANUFACTURING AN ELECTRONIC ASSEMBLY; AN ELECTRONIC ASSEMBLY, A COVER AND A SUBSTRATE

(75) Inventors: Johannes W. Weekamp, Beek En Donk (NL); Cornelis Slob, Eindhoven (NL); Jacob M. Scheer, Utrecht (NL); Freerk E. Van Straten, Mook (NL)

(73) Assignee: NXP B.V., Eindhoven (NL)

( * ) Notice: Subject to any disclaimer, the term of this patent is extended or adjusted under 35 U.S.C. 154(b) by 294 days.

(21) Appl. No.: 12/297,022

(22) PCT Filed: Apr. 11, 2007

(86) PCT No.: PCT/IB2007/051297

§ 371 (c)(1),
(2), (4) Date: Oct. 14, 2008

(87) PCT Pub. No.: WO2007/119206

PCT Pub. Date: Oct. 25, 2007

(65) Prior Publication Data

US 2009/0159331 A1    Jun. 25, 2009

(30) Foreign Application Priority Data

Apr. 13, 2006  (EP)  .................. 06112653

(51) Int. Cl.
  *H05K 7/02*  (2006.01)
(52) U.S. Cl. .................. 174/541; 174/558; 257/707; 257/737; 257/778; 29/825
(58) Field of Classification Search .................. 174/541, 174/558, 520; 257/704, 737, 778; 29/825
See application file for complete search history.

(56) References Cited

U.S. PATENT DOCUMENTS

| 5,317,922 A | 6/1994 | Bomback et al. |
| 6,392,144 B1 * | 5/2002 | Filter et al. .................. 174/535 |
| 6,621,163 B2 | 9/2003 | Weekamp et al. |

(Continued)

FOREIGN PATENT DOCUMENTS

EP          0951069 A       10/1999

(Continued)

*Primary Examiner*—Hung V Ngo

(57) ABSTRACT

The present invention relates to a method for manufacturing an electronic assembly (50) comprising an electronic component, a cavity and a substrate which method comprises; —providing an electronic component (10) having a first pattern with a substantially closed configuration; —providing a cover (18) on a surface of the electronic component, which cover together with said surface defines a cavity (20), the closed configuration of the first pattern substantially enclosing the cover at said surface; —providing a substrate (30) having a second pattern with a substantially closed configuration, which closed configuration at least partially corresponds to the closed configuration of the first pattern and comprises a solder pad; —disposing solder material at the solder pad; —positioning the electronic component and the substrate so as to align both the substantially closed configurations of the first and second pattern, while the substrate supports a top surface (28) of the cover; —reflow-soldering the solder material, therewith providing a soldered connection (52) between the first and second pattern. Furthermore the present invention relates to an electronic assembly (50), a cover (18) and a substrate (30).

10 Claims, 3 Drawing Sheets

U.S. PATENT DOCUMENTS

Figure 1A:
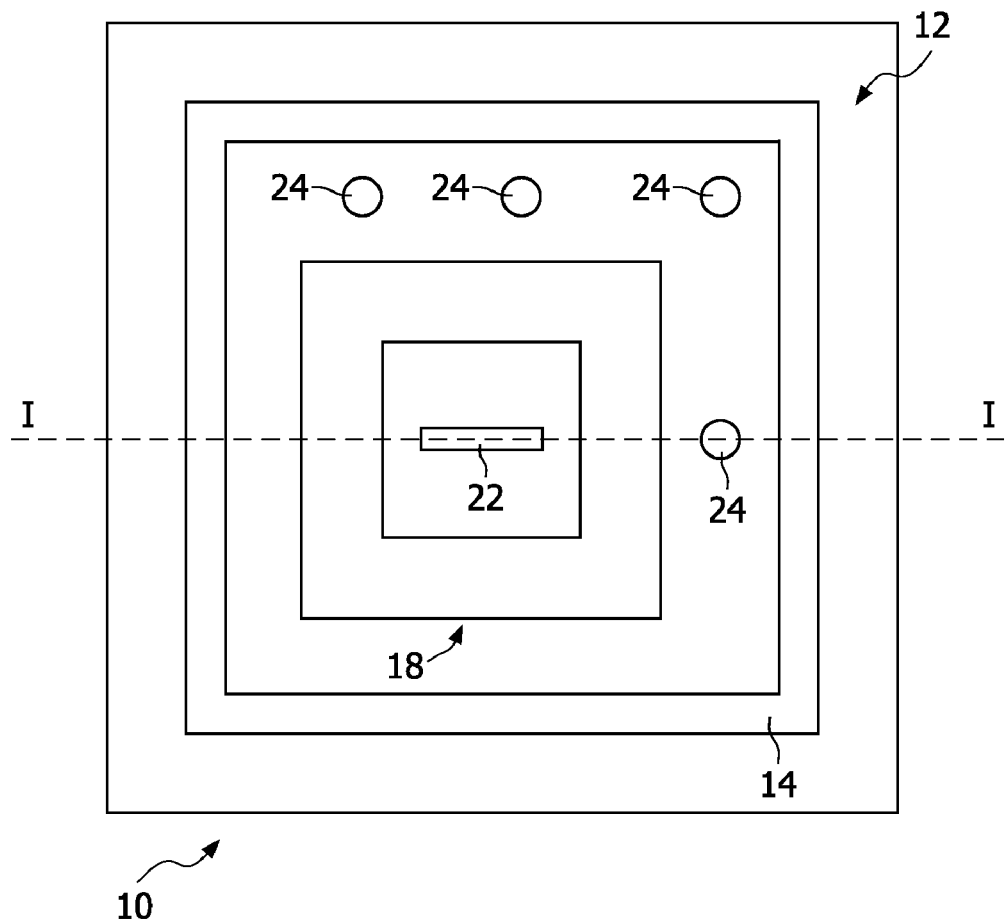

| | | |
|---|---|---|
| 6,953,985 B2 * | 10/2005 | Lin et al. .................... 257/659 |
| 2003/0183407 A1 * | 10/2003 | Ma et al. .................... 174/52.4 |
| 2003/0214029 A1 * | 11/2003 | Tao et al. .................... 257/723 |
| 2004/0016995 A1 * | 1/2004 | Kuo et al. .................... 257/678 |
| 2004/0100772 A1 * | 5/2004 | Chye et al. .................. 361/702 |
| 2005/0042790 A1 * | 2/2005 | Ma ............................. 438/51 |
| 2006/0108697 A1 * | 5/2006 | Wang et al. ................. 257/777 |
| 2006/0115323 A1 * | 6/2006 | Coppeta et al. ............. 403/270 |

FOREIGN PATENT DOCUMENTS

| | | |
|---|---|---|
| FR | 2780200 A1 | 12/1999 |
| WO | 0156921 A | 8/2001 |
| WO | 2005043573 A | 5/2005 |

* cited by examiner

METHOD FOR MANUFACTURING AN ELECTRONIC ASSEMBLY; AN ELECTRONIC ASSEMBLY, A COVER AND A SUBSTRATE

The present invention relates to a method for manufacturing an electronic assembly comprising an electronic component, a cavity, and a substrate.

Such a method is known for example from EP0951069. This document discloses the assembly of an electronic component to a substrate by means of a solder ring, such that at least a part of the component is present in a cavity. The electronic component comprises a microstructure, such as a MEMS (micro-electronic-mechanical-system) element, that is disposed in the cavity. The solder ring is present on the electronic component, while a corresponding metal pattern is present on the substrate. One forms the cavity by aligning and bonding the solder ring with the metal pattern. The ring hereby forms a closed configuration, while the combination of component, solder ring and substrate forms a hermetically sealing. In order to allow the removal of undesired gases from the cavity, an indent is created in the solder ring prior to the bonding step. Alternatively the indent can be used to fill the cavity with a desired gas under a desired pressure during bonding. The subsequent reflow soldering step results in the final closure of the cavity.

It is a disadvantage of the known method from the previous paragraph that in order to obtain a proper soldered connection the use of some kind of flux to remove unwanted oxides is unavoidable. It is known that this flux readily can damage the unprotected and delicate MEMS structure, for example by migration of the corrosive flux.

The processes preceding the soldering step as disclosed in EP0951069, such as deposition and patterning of a metallization seed layer on an electronic component or substrate, also entail the risk of damaging the MEMS structure. This can occur for example when the substrate and a metallization device or tool are not properly aligned.

It is therefore the object of the invention to provide another method for manufacturing an electronic assembly, which does not have the aforementioned disadvantages.

To achieve this object the present invention provides a method for manufacturing an electronic assembly comprising an electronic component, a cavity, and a substrate, which method comprises;
   providing an electronic component having a first pattern with a substantially closed configuration;
   providing a cover on a surface of the electronic component, which cover together with said surface defines a cavity, the closed configuration of the first pattern substantially enclosing the cover at said surface;
   providing a substrate having a second pattern with a substantially closed configuration, which closed configuration at least partially corresponds to the closed configuration of the first pattern and comprises a solder pad;
   disposing solder material at the solder pad;
   positioning the electronic component and the substrate so as to align both the substantially closed configurations of the first and second pattern, while the substrate supports a top surface of the cover;
   reflow-soldering the solder material, therewith providing a soldered connection between the first and second pattern.

By providing a cover on the electronic component according to the present invention one obtains some kind of temporary protection of the cavity, early in the manufacturing or bonding process. It is not required per se that the cover hermetically seals the cavity. The cover efficiently functions as a temporary protection during the subsequent process steps of any MEMS structure or similar structure that is accommodated in the cavity. Hermetical sealing of the cavity can then be obtained during reflow soldering of the solder material. Herewith a soldered structure is obtained that is defined by both the closed configurations and that completely surrounds the cover.

When a plurality of covers is disposed on wafer level, these covers will provide adequate protection during any dicing and transportation of the individual electronic components.

Furthermore the present invention provides an efficient and flexible method of providing a soldered connection between an electronic component and a substrate. Disposing a sufficient amount of solder material merely at the solder pad of the substrate is sufficient to obtain a proper soldered connection between both substantially closed configurations, as will be explained below in more detail.

Another advantage is that with relation to the substrate supporting a top surface of the cover, the distance between the electronic component and the substrate is defined by the height of the cover, which allows controlling such distance in a flexible manner. Furthermore the cover will provide a more stable and reliable support of the electronic component during aligning and bonding or soldering as compared to the situation during these process steps as it is disclosed in EP0951069.

The cover can be manufactured for example with the method as disclosed in U.S. Pat. No. 6,621,163B2, as will be explained in more detail below. Although this document discloses a method for providing a cover having a cavity on an electronic component, it does not disclose using such a cover as temporary package or having a substrate that is connected to the electronic component supporting the cover.

According to a further elaboration of the invention the step of providing a cover on a surface of the electronic component comprises;
   disposing a first layer on said surface, the first layer leaving an exposed area, the first layer substantially encloses said area;
   disposing a second layer on the first layer, the second layer covering said area. This provides a simple and efficient method of manufacturing the cover comprising the cavity similar to the method as described in U.S. Pat. No. 6,621,163B2. The first layer can be applied with common techniques such as screen-printing. The second layer may comprise a solid foil, such as a photosensitive organic film. Preferably both layers comprise a solder-repellent substance. It will be obvious that any MEMS element or similar structure is located at the area that is surrounded by the first layer.

According to a further elaboration of the invention the steps of providing an electronic component and a substrate respectively comprise providing a first pattern having contact areas, which are electrically connected to electric contacts of the electronic component, and providing a second pattern having contact areas, which are electrically connected to electric contacts of the substrate, the contact areas of the first pattern corresponding to the contact area of the second pattern, while solder material is also provided on the contact areas of the second pattern. In this way the disposition of both patterns and the subsequent soldering step not only provides a hermetic sealing, but also provides any electrical connection that is desired between the component and the substrate. This makes other more complicated connection methods between an electronic component and a substrate such as e.g. wire bonding redundant.

According to a further elaboration of the invention a cover having an air permeable wall surrounding the cavity is provided, while prior to or during the step of reflow soldering at least the electronic component is brought in a protective environment or a vacuum environment. This allows for example to establish a low pressure or a vacuum environment within the cavity of the electronic component. Such an environment can be obtained by bringing the mutually aligned electronic component with the air permeable cover and the substrate in a vacuum environment prior to and/or during soldering. A similar principle can be used if one wants to establish some kind of protective atmosphere within the cavity. One can for example bring this electronic component in a nitrogen gas or argon gas environment prior to and/or during soldering. In case of the method as disclosed in EP0951069 one needs to make an indent in a solder layer first in order to establish a certain environment in the cavity.

Furthermore the present invention relates to an electronic assembly as claimed in claims 5 to 8. Herewith it is preferred to give the soldered connection between the substantially closed configurations of respectively the first pattern and the second pattern not only a function of hermetically sealing the cavity, but also to give it an electrical function. In particular the function of transferring the grounding signals of the electronic component seems advantageous. Furthermore it is advantageous when the electronic component comprises a MEMS element accommodated in the cavity. MEMS elements in particular should be properly protected during the processing of such electronic components, while in case of applying MEMS elements it is common to have special requirements to the environment within the cavity, such as a vacuum environment or a protective gas in the cavity. Finally it is preferred when the substrate comprises additional electronic components, which makes it possible to obtain more complicated electronic assemblies requiring special functionalities. A corresponding package could be referred to as a system in package, which term is widely used in the present technical field.

Furthermore the present invention also relates to a cover as claimed in claim 9 and a substrate as claimed in claim 10. With such a substrate it is very easy and straightforward to obtain an electronic assembly according to the present invention.

Figure 1B:
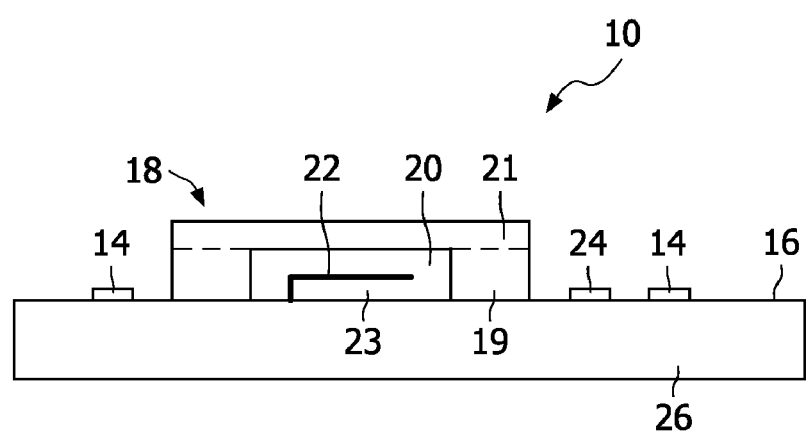
Figure 2A:
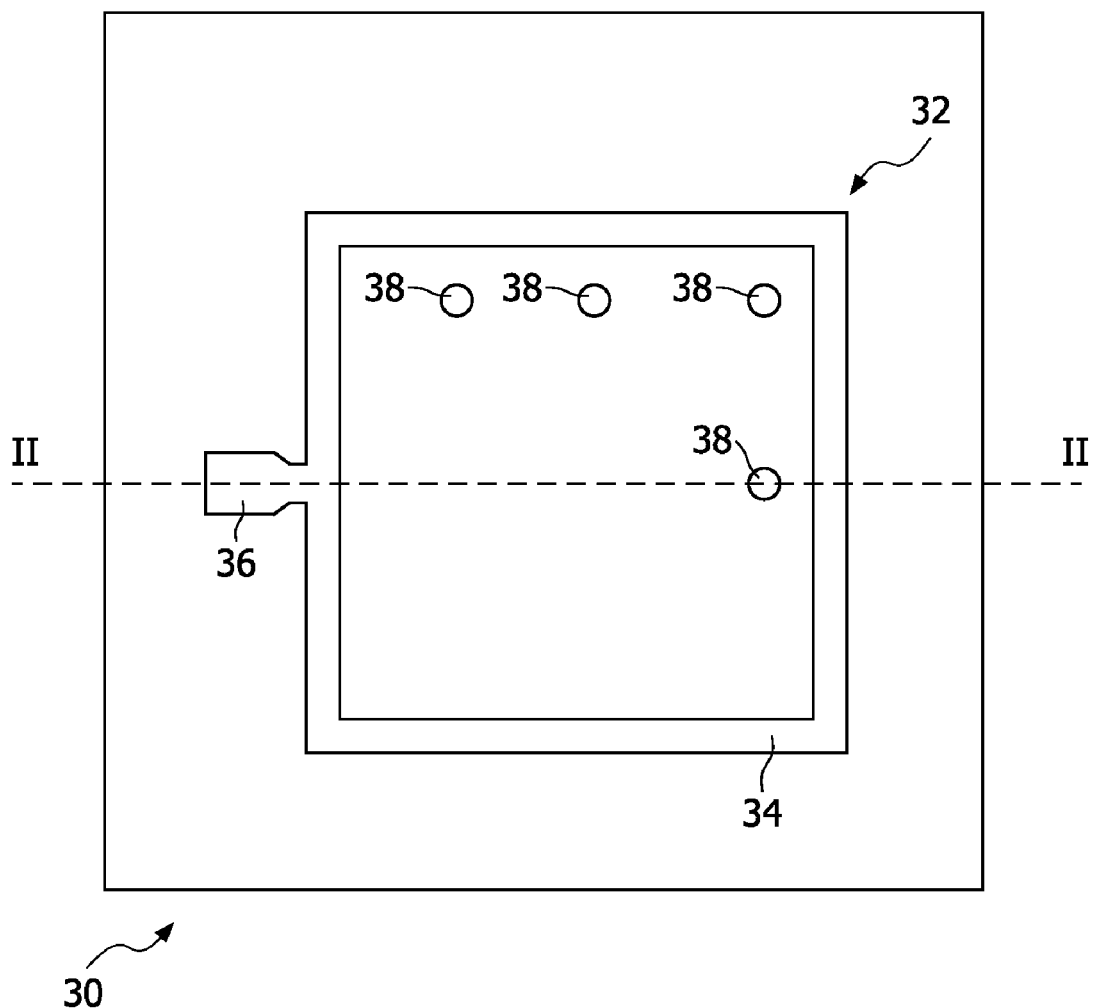
Figure 2B:
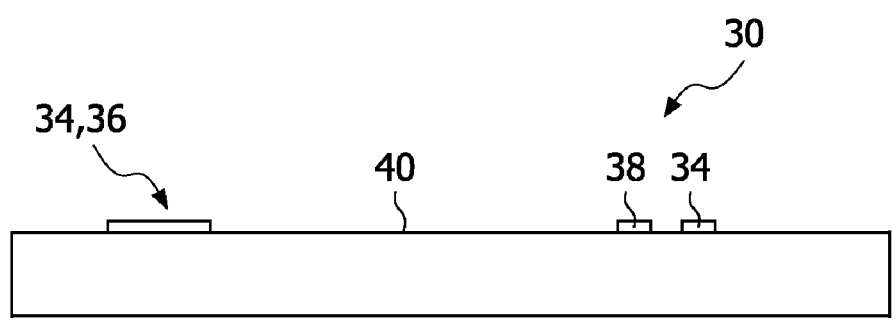
Figure 3A:
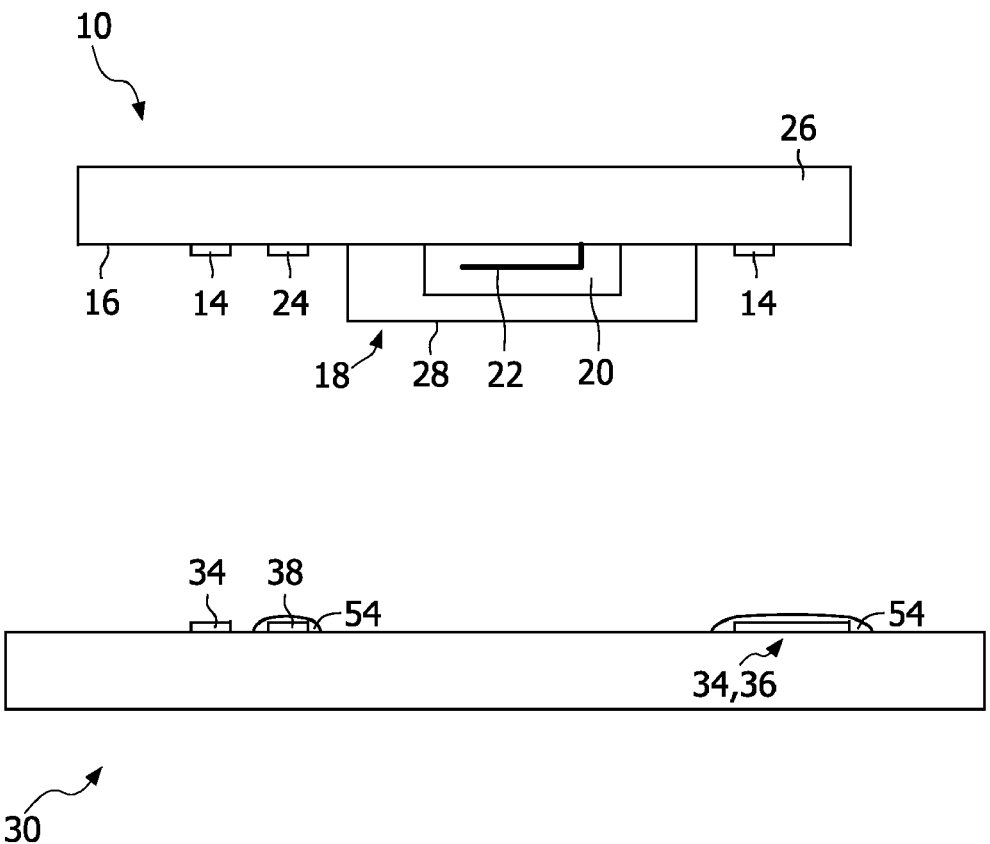
Figure 3B:
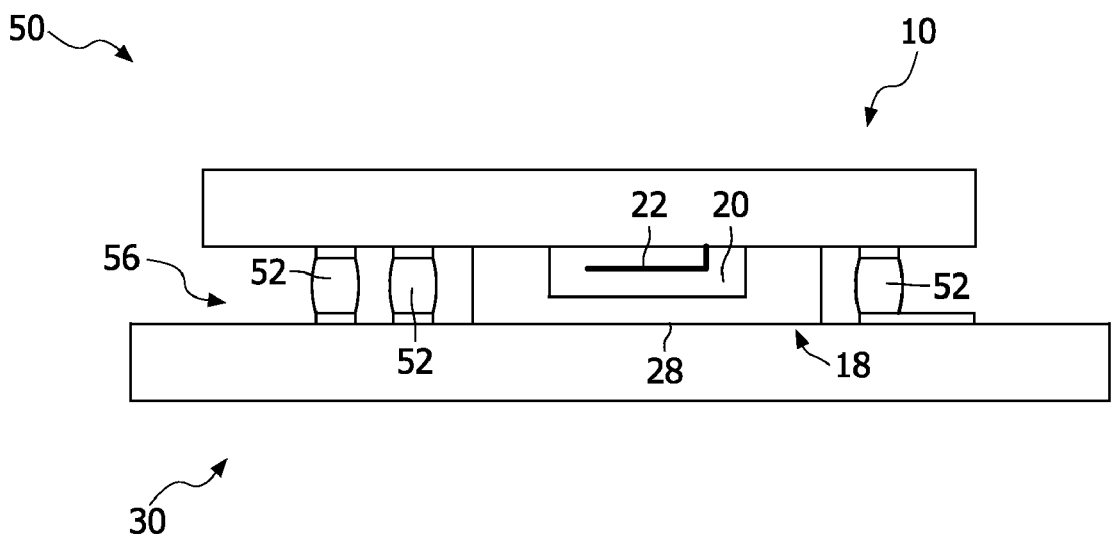

The invention will be further explained below with reference to the accompanying drawings illustrating preferred embodiments, in which:

FIGS. 1*a* and 1*b* show an electronic component in a top view and in cross-section respectively, the cross-section of FIG. 1*b* taken along line I-T in FIG. 1*a*;

FIGS. 2*a* and 2*b* show a substrate in a top view and in cross-section respectively, the cross-section of FIG. 2*b* taken along line II-II in FIG. 2*a*;

FIG. 3*a* shows an electronic component and a substrate that are mutually aligned;

FIG. 3*b* shows an electronic assembly in cross-section.

As stated earlier like reference numbers refer to like parts in the drawings.

Referring now to FIGS. 1*a* and 1*b*, an electronic component 10 having a first pattern 12 with a substantially closed configuration 14 can be seen. On a surface 16 of the electronic component a cover 18 is disposed. The cover 18 together with the surface 16 defines a cavity 20. The cavity 20 accommodates a MEMS element 22. The first pattern comprises contact areas 24 that are connected to electric contacts of the electronic component (not shown).

As is shown in FIGS. 1*a* and 1*b* the enclosed configuration 14 of the first pattern encloses 12 the cover 18 at surface 16. Here the closed configuration 14 has a rectangular shape. However it is also possible to have a circular, hexagonal or any other suitable shape.

Preferably a main body 26 of the electronic component 10 comprises an integrated circuit, bond pads of such an integrated circuit being connected to the contact areas 24. The MEMS element 22 is part of the integrated circuit and can for example function as a switch, a tunable capacitor or a sensor. Instead of a MEMS element it is also possible to apply a bulk acoustic wave filter (BAW), a surface acoustic wave filter (SAW), or another type of sensor.

Although the contact areas here are preferably located within the closed configuration, they can also be located at the outside thereof.

FIG. 1*b* illustrates how one preferably manufactures the cover 18 on the surface 16 of the electronic component 10. First one disposes a first layer 19 on surface 16, which first layer leaves an exposed area 23 on the surface 16 such that the first layer substantially encloses this area. Next one disposes a second layer 21 on the first layer 19, while the second layer covers the area 23. The first layer can be applied with common techniques such as screen-printing. The second layer may comprise a solid foil, such as a photosensitive organic film. Preferably both layers comprise a solder-repellent substance. The material of the cover preferably is a polymeric material that can withstand both the temperatures and the chemical substances that one applies during reflow soldering.

Referring now to FIGS. 2*a* and 2*b*, a substrate 30 having a second pattern 32 disposed on a surface 40 of the substrate can be seen. The second pattern 32 comprises a substantially closed configuration 34, a solder pad 36 being connected to the closed configuration 34. Furthermore the second pattern 32 comprises contact areas 38 that are electrically connected to electric contacts of the substrate (not shown). Such electric contacts are part of an electronic layout of the substrate. In this way it is possible to connect the second pattern with other electronic components connected at other parts of the substrate, for example when larger substrates are applied. The substrate for example can be a printed circuit board. However it is also possible to have a substrate made of semiconductor material, which is advantageous with relation to differences in thermal expansion between the component and the substrate.

As will be apparent when viewing both FIG. 1*a* and FIG. 2*a* the second pattern corresponds to the first pattern, at least with respect to their geometry. This holds true both for the closed configurations 14, 34 and for the contact areas 24, 38.

After illustrating the construction of the electronic component 10 and the substrate 30 the method for manufacturing an electronic assembly can now be explained referring to FIGS. 3*a* and 3*b*.

In FIG. 3*a* the electronic component 10 and the substrate 30 are mutually aligned so as to align both substantially closed configurations 14, 34 of the first and second pattern. Herewith also the contact areas 24, 34 of respectively the first 12 and the second pattern 32 are mutually aligned. An amount or a droplet of solder material 54 is disposed on the solder pad 36 and the contact areas 38 respectively. Preferably this is done before aligning the electronic component 10 and the substrate 30. The solder material 54 or solder paste should be sufficient to establish the soldering connection, as is discussed below.

In the subsequent step first the substrate 30 and the electronic component 10 are mutually positioned so as to have the substrate 30 support a top surface 28 of the cover 28 (see FIG. 3*b*, although it should be noted that this figure shows the component and substrate after reflow soldering). In this aligned and supportive position the substrate 30 and the electronic component 10 are put in a reflow furnace, in which the reflow soldering takes place. The reflow soldering results in a soldered connection 52 between the first and the second pattern, or more precisely between both closed configurations 14, 34 and opposing contact areas 24 and 38. After such soldering the final electronic assembly 50, as shown in FIG. 3b is obtained.

Due to the relatively narrow opening 56 between the electronic component 10 and the substrate 30 on the one hand and the difference in wetting properties between the material of both closed configurations 14,34 and the material of respectively surfaces 16 and 40 on the other, the solder material 54 will automatically flow between both closed configurations upon soldering. Herewith a soldered structure is obtained, that is capable of hermetically sealing the cavity 20. Prior to reflow soldering the cover 18 protects the cavity 20.

If so required, one can obtain a vacuum or protective environment within the cavity. To this end one can put at least the electronic component in such an atmosphere just before or during soldering. Having a cover that has an air permeable wall can for example facilitate this.

Particularly preferred, in the context of the assembly of the present invention, is a MEMS component with a movable electrode that is defined in a layer on top of a substrate. Suitably, the movable electrode is primarily constituted of metal or comprising a piezoelectric material. Such a MEMS component is for instance known from WO-A 2005/043573. While a MEMS component with a movable electrode that is defined in a substrate may be covered by deposition of certain low-pressure or phase enhanced CVD layers such as silicon nitride, silicon oxide or even polysilicon, this appears not possible with a MEMS component with a movable electrode above the substrate. The preferred MEMS components with a movable electrode above the substrate is however preferred for use as a tunable capacitor or as a switch, particularly for RF applications. Advantageously the movable electrode is provided with a metal layer that is sufficiently thick so as to enable a low-impedance interconnect to the MEMS component. Most suitably, further passive components such as non-variable capacitors, resistors and/or inductors are integrated with the MEMS. These may be defined outside the cavity. Suitably, the substrate of the MEMS component is a semiconductor substrate. Resistivity of the substrate may be tuned to improve the quality factor of available components, particularly any inductors.

Although this is not shown in FIG. 3b, the substrate preferably comprises additional electronic components, which are connected to electrical contacts of the substrate. Such additional components can be both active components, such as an integrated circuit possibly also comprising a MEMS element, or passive components.

Of course any proportion between the dimensions of the individual parts here cannot be derived from the drawings, as they are only provide a schematic picture. Referring to FIG. 1b the first layer 19 has a thickness of approximately 40 micrometer. The second layer 21 has a thickness of approximately 60 micrometer. Therefore the height of the cover maximally is approximately 40 micrometer.

The temperature during reflow soldering is approximately 280±10° C. Preferably a soldering alloy having a high melting point is used, such as 90-10 PbSn. Preferably during possible subsequent bonding steps, e.g. soldering additional components to the substrate, a temperature lower than 280±10° C. is used. Herewith it is prevented that the soldered connection 52 melts during such steps. One can for example solder at 250-260° C.

For the first and second pattern preferably a nickel layer is applied, which layer has a gold finish.

The electronic layout of the substrate comprises several layers of conductive material to transfer electronic signals from surface 40 to other parts of the substrate. Such signals are transferred from the electronic component to this surface via contact areas 24, 38 and the soldered connection 52 respectively. If so required one can also use the soldered connection between the closed configurations 14, 34 for this purpose, for example to transfer grounding signals.

It should be noted that the above-mentioned embodiments illustrate rather than limit the invention, and that those skilled in the art will be capable of designing many alternative embodiments without departing from the scope of the invention as defined by the appended claims. In the claims, any reference signs placed in parentheses shall not be construed as limiting the claims. The verb "comprise" and its conjugations do not exclude the presence of elements or steps other than those listed in any claim or the specification as a whole. The singular reference of an element does not exclude the plural reference of such elements or vice-versa.

The invention claimed is:

1. A method for manufacturing an electronic assembly comprising an electronic component, a cavity and a substrate, which method comprises;
   providing an electronic component having a first pattern with a substantially closed configuration;
   providing a cover a surface of the electronic component, which cover together with said surface defines a cavity, the closed configuration of the first pattern substantially enclosing the cover at said surface;
   providing a substrate having a second pattern with a substantially closed configuration, which closed configuration at least partially corresponds to the closed configuration of the first pattern and comprises a solder pad;
   disposing solder material the solder pad;
   positioning the electronic component and the substrate so as to align both the substantially closed configurations of the first and second pattern, while the substrate supports a top surface of the cover;
   reflow-soldering the solder material, therewith providing a soldered connection between the first and second pattern.

2. A method as claimed in claim 1, wherein the step of providing a cover on a surface of the electronic component comprises;
   disposing a first layer on said surface, the first layer leaving an exposed area, the first layer substantially encloses said area;
   disposing a second layer on the first layer, the second layer covering said area.

3. A method as claimed in claim 1, wherein the steps of providing an electronic component and a substrate respectively comprise providing a first pattern having contact areas, which are electrically connected to electric contacts of the electronic component, and providing a second pattern having contact areas, which are electrically connected to electric contacts of the substrate, the contact areas of the first pattern corresponding to the contact area of the second pattern, and wherein solder material is also provided on the contact areas of the second pattern.

4. A method as claimed in claim 1, wherein a cover having an air permeable wall surrounding the cavity is provided and prior to or during the step of reflow soldering at least the electronic component is brought in a protective environment or a vacuum environment.

5. An electronic assembly comprising;
an electronic component, a cover disposed on a surface of the electronic component, a cavity located between the surface and the cover, and a first pattern disposed on said surface, which first pattern has a substantially closed configuration and has contact areas connected to electric contacts of the electronic component, which closed configuration substantially encloses the cover at said surface;
a substrate, which supports a top surface of the cover and comprises a second pattern disposed on a surface of the substrate, which second pattern has a substantially closed configuration and has contact areas electrically connected to electric contacts of the substrate, which closed configuration at least partially corresponds to the closed configuration of the first pattern and comprises a solder pad;
a soldered connection between the first and second pattern.

6. An electronic assembly as claimed in claim 5, wherein the soldered connection between the substantially closed configurations of respectively the first pattern and the second pattern provides an electrical function, such as a grounding function.

7. An electronic assembly as claimed in claim 5, wherein the electronic component comprises a MEMS element accommodated in the cavity.

8. An electronic assembly as claimed in claim 5, wherein the substrate comprises additional electronic components.

9. A cover to be used for an electronic assembly as claimed in claim 5.

10. A substrate to be used for an electronic assembly as claimed in claim 5, wherein the substrate comprises a second pattern having a substantially closed configuration, which pattern comprises a solder pad connected to the substantially closed configuration and contact areas electrically connected to electric contacts of the substrate, and the substrate comprises an amount of solder material disposed on the solder pad and the contact areas.

* * * * *